(12) United States Patent
Andresakis et al.

(10) Patent No.: US 6,500,349 B2
(45) Date of Patent: Dec. 31, 2002

(54) MANUFACTURE OF PRINTED CIRCUITS USING SINGLE LAYER PROCESSING TECHNIQUES

(75) Inventors: John Andresakis, Clifton Park, NY (US); Dave Paturel, San Gabriel, CA (US)

(73) Assignee: Oak-Mitsui, Inc., Hoosick Falls, NY (US)

( * ) Notice: Subject to any disclaimer, the term of this patent is extended or adjusted under 35 U.S.C. 154(b) by 209 days.

(21) Appl. No.: 09/748,782

(22) Filed: Dec. 26, 2000

(65) Prior Publication Data
US 2002/0079288 A1 Jun. 27, 2002

(51) Int. Cl.$^7$ .............................. B44C 1/22; C23F 1/00
(52) U.S. Cl. .............................. 216/13; 216/20; 216/34; 216/35; 216/105
(58) Field of Search .............................. 216/13, 20, 33, 216/34, 35, 41, 105, 106, 107

(56) References Cited

U.S. PATENT DOCUMENTS

| | | | | |
|---|---|---|---|---|
| 2,849,298 A | * | 8/1958 | Werbering ................ | 216/20 X |
| 3,536,545 A | * | 10/1970 | Traynor et al. ............ | 216/20 X |
| 4,411,982 A | | 10/1983 | Shibuya et al. ............ | 430/314 |
| 4,997,516 A | | 3/1991 | Adler ........................ | 156/630 |
| 5,679,230 A | | 10/1997 | Fatcheric et al. ............ | 205/50 |
| 5,707,749 A | | 1/1998 | Katagiri et al. .......... | 428/473.5 |
| 6,103,135 A | | 8/2000 | Kusner et al. ................ | 216/20 |

OTHER PUBLICATIONS

Osamu Miura, et al., "Fabrication of Thin–Film Multilayer Substrate Using Copper Clad Polyimide Sheets", XP000443352, pp. 817–820.
Dieter G. Weiss, "Manufacture of 4–Layer MCM–Ls Using Reel to Reel Manufacturing Methods", XP–008004764, Dec. 1997, pp. 102–108.
Weiss, Dieter, g., et al "Manufacture Of 4 Layer MVM–L's Using Reel To Reel Manufacturing Methods", Institute for Interconnecting andPackaging Electronic Circuits; Northbrook, Illinois; Mar. 1997, pp. S2–3–1 through S2–2–5.
Fjelstad, Joseph, "Flexible Circuit Technology", Silicon Valley Publishers Group; 1994.

* cited by examiner

Primary Examiner—William A. Powell
(74) Attorney, Agent, or Firm—Roberts & Mercanti, LLP

(57) ABSTRACT

A continuous process for forming multilayer circuit structures which includes applying and curing a film forming polymer onto the matte side of a copper foil. The opposite (shiny) side of the foil is optionally but preferably cleaned, and applied with a photoresist which is then optionally but preferably dried. The photoresist is exposed, and developed to remove the nonimage areas but leave the image areas. The foil under the removed nonimage area is then etched to form a copper pattern, and the remaining photoresist is optionally but preferably removed. The foil is then cut into sections, and then optionally but preferably punched with registration holes. The copper pattern is then optionally but preferably treated with a bond enhancing treatment, optionally but preferably inspected for defects, and laminated onto a substrate to form a multilayered circuit structure.

23 Claims, 1 Drawing Sheet

MANUFACTURE OF PRINTED CIRCUITS USING SINGLE LAYER PROCESSING TECHNIQUES

BACKGROUND OF THE INVENTION

1. Field of the Invention

The present invention relates to the manufacture of circuit boards. More particularly, the invention relates to a continuous process for forming a multilayered circuit structure, which prevents damage to conductive foils during the formation of multilayered circuit structures while enhancing etching precision and accuracy of the circuits.

2. Description of the Related Art

Circuit boards and printed circuits have wide application in the field of electronics. They are useful for large scale applications, such as in industrial control equipment, as well as in small scale devices, such as telephones, radios and personal computers. In producing such printed circuits, it is important that a high degree of accuracy and resolution is attained for very small line and space widths to ensure good performance of the circuit.

The ability to produce accurate features having very small dimensions, particularly of $100\mu$ or less, is extremely important in the production of small and large scale equipment. Etching precision becomes more important as the circuit patterns become ever smaller. It is well known in the art to use known photolithographic techniques to produce printed circuit boards having small features with a high degree of accuracy. Typically, an electrically conductive foil is deposited onto a substrate, and a photoresist is then deposited onto the foil. The photoresist is then imagewise exposed and developed, forming a pattern of small lines and spaces which are then etched into the conductive foil.

It is a common practice to then subject the foil to a bond enhancement such as a "black oxide" treatment, in which the copper is pre-roughened by chemical micro-etching, and is chemically treated with a layer of copper oxide (which is black). This treatment helps to promote secure adhesion of the foil to other materials. See, for example, the discussion in U.S. Pat. No. 4,997,516, which is incorporated herein by reference, for a discussion of forming a black oxide on the surface of a foil. The adhesiveness of the foil surface to prepregs or other materials is greatly enhanced by the black oxide treatment, resulting in greater heat and moisture resistance of the resulting multilayer circuit structure.

One problem that arises in the formation of circuit structures is that damage to metallic foil surfaces, resin spots on the foil, and handling of thin laminates have been known to cause low yield. This damage is mainly caused by excessive manipulation of the foils during manual handling processes, such as those presently widely used in the art. It would therefore be desirable to employ a process for forming multilayer circuit structures which avoids or reduces damage and imperfections to metal foils, while etching circuit lines and spaces with high resolution and accuracy. The present invention provides a solution to this problem by providing a continuous process which minimizes manual handling of copper foils, to thereby avoid or reduce unnecessary damage to the foils.

Continuous processes are used in the manufacturing of flexible printed circuits that minimize yield losses due to material damage. The flexible substrate (usually a copper clad polyimide or polyester film) has a circuit pattern put on one or both sides. Typical process flows are described by J. Fjelstad, Flexible Circuit Technology, Silicon Valley Publishers Group, 1994. The reel to reel technique was also described by D. Weiss, et al "Manufacture of 4 Layer MCM-L's Using Reel to Reel Manufacturing Methods", Institute for Interconnecting and Packaging Electronic Circuits, 1997, in the production of four layer multichip modules made from epoxy laminate. He contended that if the epoxy substrate is extremely thin, it would be flexible enough to be processed in a continuous process. The problem with epoxy substrates is that the core thickness is limited to approximately 150 microns, since above that the substrate loses flexibility. Additionally the current flexible printed circuit process is limited in substrate thickness between 50 and 200 microns in 50 micron increments. The present invention addresses these issues in that a wide range of finished product thickness can be obtained in very small increments.

According to the present invention, multilayer circuit structures are formed by a continuous process which includes applying and curing a film forming polymer onto the matte side of a copper foil. The opposite (shiny) side of the foil is optionally but preferably cleaned, and applied with a photoresist which is then optionally but preferably dried. The photoresist is exposed, and developed to remove the nonimage areas but leave the image areas. The foil under the removed nonimage area is then etched to form a copper pattern, and the remaining photoresist is optionally but preferably removed. The foil is then cut into sections, and then optionally but preferably punched with registration holes. The copper pattern is then optionally but preferably treated with a bond enhancing treatment, optionally but preferably inspected for defects, and laminated onto a substrate to form a multilayered circuit structure. This approach is preferably conducted in a reel to reel manner. This technique results in more accurate etching and better etch uniformity than known methods, because the optimal orientation (face down) through the wet processing steps can be utilized.

SUMMARY OF THE INVENTION

The invention provides a continuous process for forming a multilayered circuit structure which comprises:

(a) unrolling a roll of copper foil, which foil has a shiny surface side and a matte surface side;

(b) applying and curing a film-forming polymer onto the matte side of the foil, (c) optionally cleaning the shiny side of the foil;

(d) applying and optionally drying a photoresist onto the shiny side of the foil;

(e) imagewise exposing the photoresist to actinic radiation to thereby form image and nonimage areas;

(f) developing the photoresist thereby removing the nonimage areas and leaving the image areas;

(g) etching the foil under the removed nonimage areas of the photoresist to thereby form a copper pattern;

(h) optionally removing the remaining photoresist;

(i) cutting the foil into sections;

(j) optionally punching registration holes through the foil;

(k) optionally treating the copper pattern with a bond enhancing treatment;

(l) optionally inspecting the copper pattern for defects; and (m) laminating at least one foil section to a substrate; thus forming a multilayered circuit structure.

The invention also provides a continuous process for forming a multilayered circuit structure which comprises:

(a) unrolling a roll of copper foil, which foil has a shiny surface side and a matte surface side;

(b) applying and curing a film-forming polymer onto the matte side of the foil, (c) cleaning the shiny side of the foil;

(d) applying and drying a photoresist onto the shiny side of the foil;

(e) imagewise exposing the photoresist to actinic radiation to thereby form image and nonimage areas;

(f) developing the photoresist thereby removing the nonimage areas and leaving the image areas;

(g) etching the foil under the removed nonimage areas of the photoresist to thereby form a copper pattern;

(h) removing the remaining photoresist;

(i) cutting the foil into sections;

(j) punching registration holes through the foil;

(k) treating the copper pattern with a bond enhancing treatment;

(l) inspecting the copper pattern for defects; and (m) laminating at least one foil section to a substrate; thus forming a multilayered circuit structure.

The invention further provides a continuous process for forming a multilayered circuit structure which comprises:

(a) unrolling a roll of copper foil, which foil has a shiny surface side and a matte surface side, both sides having been treated with bond enhancing treatment;

(b) applying and curing a film-forming polymer onto either side of the foil, (c) optionally cleaning the side of the foil that has not been applied with the film-forming polymer;

(d) applying and optionally drying a photoresist onto the uncoated side of the foil;

(e) imagewise exposing the photoresist to actinic radiation to thereby form image and nonimage areas;

(f) developing the photoresist thereby removing the nonimage areas and leaving the image areas;

(g) etching the foil under the removed nonimage areas of the photoresist to thereby form a copper pattern;

(h) optionally removing the remaining photoresist;

(i) cutting the foil into sections;

(j) optionally punching registration holes through the foil;

(k) optionally inspecting the copper pattern for defects; and (l) laminating at least one foil section to a substrate; thus forming a multilayered circuit structure.

The invention still further provides a continuous process for forming a multilayered circuit structure which comprises:

(a) unrolling a roll of copper foil, which foil has a shiny surface side and a matte surface side, whose shiny side has been treated with a bond enhancing treatment;

(b) applying and curing a film-forming polymer onto the shiny side of the foil, (c) optionally cleaning the matte side of the foil;

(d) applying and optionally drying a photoresist onto the shiny side of the foil;

(e) imagewise exposing the photoresist to actinic radiation to thereby form image and nonimage areas;

(f) developing the photoresist thereby removing the nonimage areas and leaving the image areas;

(g) etching the foil under the removed nonimage areas of the photoresist to thereby form a copper pattern;

(h) optionally removing the remaining photoresist;

(i) cutting the foil into sections;

(j) optionally punching registration holes through the foil;

(k) optionally treating the copper pattern with a bond enhancing treatment;

(l) optionally inspecting the copper pattern for defects; and (m) laminating at least one foil section to a substrate; thus forming a multilayered circuit structure.

DETAILED DESCRIPTION OF THE PREFERRED EMBODIMENT

Figure 1:
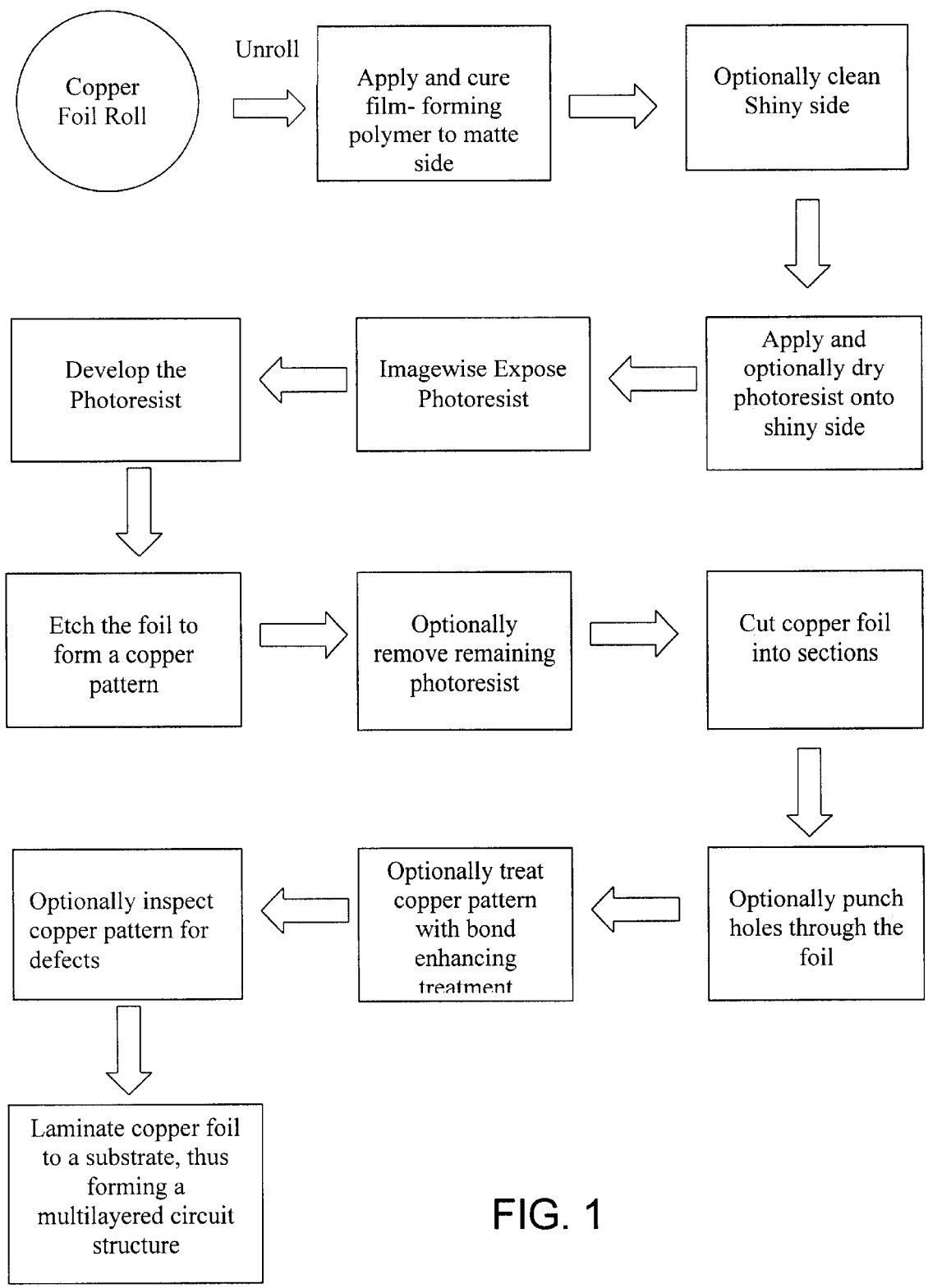
FIG. 1 shows a flow chart representing the process steps according to the invention.

The invention provides a continuous process for producing a multilayered circuit structure. The process of the present invention is preferably conducted in a reel to reel manner.

The first step in one embodiment of the present invention is to unroll a roll of copper foil having a shiny surface side and a matte surface side. According to the invention, the term "copper foil" preferably comprises copper or a copper alloy. Copper alloys may contain zinc, chrome, nickel, aluminum, stainless steel, iron, titanium and combinations thereof. Copper foils can be manufactured by well known electrodeposition processes. One preferred process includes electrodepositing copper from a solution of a copper salt onto a rotating metal drum. The side of the foil next to the drum is typically the smooth or shiny side, while the other side has a relatively rough surface, also known as the matte side. This drum is usually made of stainless steel or titanium which acts as a cathode and receives the copper as it is deposited from solution. An anode is generally constructed from a lead alloy. A cell voltage of about 5 to 10 volts is applied between the anode and the cathode to cause the copper to be deposited, while oxygen is evolved at the anode. This copper foil is then removed from the drum.

The foil's shiny side, matte side, or both, may optionally be pre-treated with a bond enhancing treatment known in the art, which may serve as an adhesion promoter for the copper foil. One preferred bond enhancing treatment includes Durabond, a tin oxide, which can be purchased commercially from McGean Rohco Inc. of Cleveland, Ohio. Other suitable bond enhancing treatments also nonexclusively include oxide treatments. One preferred oxide treatment is black oxide treatment, which oxidizes the copper foil with an oxidant thereby to convert the copper on the substrate to spiny copper oxide. Black oxide treatment preferably uses, as a treating solution, a solution of an oxidant such as sodium hypochlorite. Since the oxidant solution is alkaline, copper foils treated with the oxidant solution may need to be washed after the treatment. One supplier of this chemistry is Electrochemicals Inc. of Maple Plains, Minn.

A film forming polymer composition is then applied and cured onto one side of the foil. It is preferred that the film forming polymer composition is applied and cured onto a side of the foil which has been pre-treated with a bond enhancing treatment. This may be done to either side of the foil, preferably the matte side. In an embodiment where both sides of the foil have been pre-treated with a bond enhancing treatment as described above, then the polymer composition may be applied and cured onto either side of the foil. The copper foil is preferably partially or fully unrolled prior to the application and curing of the film forming polymer composition. Suitable film forming polymers nonexclusively include polyimides, polyesters, polyester containing co-polymers, polyarylene ethers, liquid crystal polymers, polyphenylene ethers, amines, and combinations thereof. Of these, polyimides and polyesters are the most preferred. The film forming polymer composition may optionally contain a filler. The film forming polymer composition may be applied by conventional techniques such as spraying, meniscus coating, doctoring blade coating, sputtering, evaporation, vapor deposition or the like to allow for control and uniformity of the polymer thickness. The polymer is then preferably cured onto the foil, thus forming a prepreg. Curing is preferably conducted by conventional techniques such as heating in an oven. Preferably, heat curing is performed at a temperature of from about 100° F. to about 600° F., for about 1 to about 10 minutes. After curing, the copper foil may be re-rolled for inspection and/or storage and unrolled at a later time for completion of subsequent steps according to the invention. Such re-rolling and unrolling may be done by any suitable method known in the art, such as by using an accumulator.

Next, the side of the foil which has not been applied with the film forming polymer may optionally be cleaned using conventional techniques. In an embodiment where the matte side has been applied with the polymer, then the shiny side may optionally be cleaned. Conversely, in an embodiment where the shiny side has been applied with the polymer, then the matte side may optionally be cleaned. It is preferred that the foil is partially or fully unrolled prior to cleaning. Cleaning may be done by any conventional method known in the art, such as micro-etching with sodium persulfate or rinsing with mild sulfuric acid.

Next, a photoresist is applied and optionally but preferably dried, onto the side of the foil opposite to that applied with the polymer. The photoresist composition may be positive working or negative working and is generally commercially available. Suitable positive working photoresists are well known in the art and may comprise an o-quinone diazide radiation sensitizer. The o-quinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, N.J. as well as Shipley I-line photoresist. Negative photoresists are also widely commercially available. The photoresist is preferably applied onto the shiny side of the foil by conventional techniques such as mentioned above. The thickness of photoresist layers may vary depending on the deposition procedure used. The photoresist may then optionally be dried onto the foil by conventional techniques such as heating. After applying and optionally drying the photoresist onto the foil, the copper foil may be re-rolled for inspection and/or storage and unrolled at a later time for completion of subsequent steps according to the invention. Such re-rolling and unrolling may be done by any suitable method known in the art, such as using an accumulator.

The photoresist is then imagewise exposed to actinic radiation such as light in the visible, ultraviolet or infrared regions of the spectrum through a mask, or scanned by an electron beam, ion or neutron beam or X-ray radiation, to thereby form image and nonimage areas. The foil should be unrolled prior to exposure. Actinic radiation may be in the form of incoherent light or coherent light, for example, light from a laser. In one embodiment, the process of the invention may be temporarily or permanently stopped after exposure of the photoresist to radiation.

The photoresist is then imagewise developed using a suitable solvent, such as an aqueous alkaline solution, thereby removing the nonimage areas and leaving the image areas. Preferred solvent developers are widely commercially available and may comprise aqueous sodium hydroxide, potassium hydroxide or sodium carbonate solutions.

The next step is to selectively etch away portions of the copper foil under the removed nonimage areas of the photoresist layer, forming an etched copper pattern. This photoresist pattern defines an excellent quality etch mask for etching the conductive layer with high accuracy and precision. This etched pattern may be formed by conventional techniques such as acid etching and alkaline etching. Suitable etchants non-exclusively include alkaline solutions or acidic solutions, such as cupric chloride or nitric acid. Also preferred are ferric chloride or sulfuric peroxide. The remaining photoresist may then optionally be removed using conventional techniques such as stripping or ashing. In one embodiment, the process of the present invention may be temporarily or permanently stopped after removal of the photoresist.

The foil is then cut preferably into sections by conventional techniques. The sections are preferably squares, but may be any other shape necessary for a particular application or process. Registration holes may then optionally be punctured through the foil. The holes are preferably made using a punch system, however any other method known in the art may alternatively be used. It is preferred that the registration holes are punched prior to lamination of the foil.

Next, the copper pattern may be optionally treated with a bond enhancing treatment, which serves as an adhesion promoter for the copper foil to the bonding material (such as a fiberglass cloth coated with epoxy resin)

The next step according to the invention is the lamination the foil to a substrate. Prior to lamination, the copper pattern may optionally be inspected for defects. The optional inspection may be conducted by any suitable method known in the art. Preferred methods nonexclusively include in-line optical inspection, random sampling, electrical testing, and visual inspection.

According to the invention, at least one foil section is laminated to a substrate, thus forming a multilayered circuit structure. In the practice of the invention, a plurality of foil sections may be laminated together. Also, a plurality of the foil sections may be laminated together via a substrate between adjacent sections. Lamination is preferably conducted in a press at a temperature of from about 160° C. to about 320° C., more preferably from about 170° C. to about 245° C. and most preferably from about 175° C. to about 230° C. Lamination time preferably ranges from about 15 minutes to about 180 minutes, more preferably from about 30 minutes to about 120 minutes, and most preferably from about 30 minutes to about 90 minutes. Preferably, the press is under a vacuum of from at least 25 to about 30 mm of mercury, more preferably from about 28 to about 30 mm of mercury, and most preferably from about 29 to about 30 inches of mercury. The press pressure is preferably maintained at about 3.5 to about 70 kg/cm$^2$, more preferably from about 7 to about 30 kg/cm$^2$, and most preferably from about 9 kg/cm$^2$ to about 21 kg/cm$^2$.

Typical substrates are those suitable to be processed into a printed circuit or other microelectronic device. Suitable substrates for the present invention non-exclusively include epoxies, polyimides, polyesters, cyanate ester, BT-Epoxy or combinations thereof, polymers reinforced with materials such as fiberglass, organic paper, aramid (Kevlar), aramid paper (Thermount), polybenzoxolate paper or combinations thereof. Of these, epoxy with fiberglass reinforcement is the most preferred substrate. The preferred thickness of the substrate is of from about 10 to about 200 µm, more preferably from about 10 to about 50 µm.

In one embodiment of the present invention, the optional steps of cleaning the foil, drying the photoresist, removing the remaining photoresist, punching registration holes through the foil, treating the copper pattern with a bond enhancing treatment, and inspecting the copper pattern for defects are all performed.

In another embodiment, particularly when using a foil where both the sides have been subjected to bond enhancing treatment, the optional step of treating the copper pattern with a bond enhancing treatment is not performed.

In still another embodiment, prior to lamination the copper foil may be electrolytically treated on the shiny side to form a roughening copper deposit, and electrolytically treated on the matte side to deposit micro-nodules of a metal or alloy. These nodules are preferably copper or a copper alloy, and increase adhesion to a substrate. The surface microstructure of the foil is measured by a profilometer, such as a Perthometer model M4P or S5P which is commercially available from Mahr Feinpruef Corporation of Cincinnati, Ohio. Topography measurements of the surface grain structure of peaks and valleys are made according to industry standard IPC-TM-650 Section 2.2.17 of the Institute for Interconnecting and Packaging Circuits of 2115 Sanders Road, Northbrook, Ill. 60062. In the measurement procedure, a measurement length Im over the sample surface is selected. Rz defined as the average maximum peak to valley height of five consecutive sampling lengths within the measurement length Im (where Io is Im/5). Rt is the maximum roughness depth and is the greatest perpendicular distance between the highest peak and the lowest valley within the measurement length Im. Rp is the maximum leveling depth and is the height of the highest peak within the measuring length Im. Ra, or average roughness, is defined as the arithmetic average value of all absolute distances of the roughness profile from the center line within the measuring length Im. The parameters of importance for this invention are Rz and Ra. The surface treatments carried out produce a surface structure having peaks and valleys, which produce roughness parameters wherein Ra ranges from about 1 to about 10 µm and Rz ranges from about 2 to about 10 µm.

The surface treatments carried out produce a surface structure having peaks and valleys, on the shiny side, which produce roughness parameters wherein Ra ranges from about 1 to about 4 µm, preferably from about 2 to about 4 microns, and most preferably from about 3 to about 4 microns. The Rz value ranges from about 2 to about 4.5 µm, preferably from about 2.5 to about 4.5 microns, and more preferably from about 3 to about 4.5 µm.

The surface treatments carried out produce a surface structure having peaks and valleys, on the matte side, which produce roughness parameters wherein Ra ranges from about 4 to about 10 µm, preferably from about 4.5 to about 8 µm, and most preferably from about 5 to about 7.5 µm. The Rz value ranges from about 4 to about 10 µm, preferably from about 4 to about 9 µm, and more preferably from about 4 to about 7.5 µm.

Preferably, the shiny side has a copper deposit about 2 to 4.5 µm thick to produce an average roughness (Rz) of 2 µm or greater. More preferably, the matte side preferably will have a roughness Rz as made of about 4–7.5 µm. The micro-nodules of metal or alloy will have a size of about 0.5 µm. Other metals may be deposited as micro nodules if desired, for example, zinc, indium, tin, cobalt, brass, bronze and the like. This process is more thoroughly described in U.S. Pat. No. 5,679,230, which is incorporated herein by reference.

The shiny surface preferably has a peel strength ranging from about 0.7 kg/linear cm to about 1.6 kg/linear, more preferably from about 0.9 kg/linear cm to about 1.6 kg/linear. The matte surface preferably has a peel strength ranging from about 0.9 kg/linear cm to about 2 kg/linear, more preferably from about 1.1 kg/linear cm to about 2 kg/linear. Peel strength is measured according to industry standard IPC-TM-650 Section 2.4.8 Revision C.

The following non-limiting examples serve to illustrate the invention. It will be appreciated that variations in proportions and alternatives in elements of the components of the photosensitive coating composition will be apparent to those skilled in the art and are within the scope of the present invention.

EXAMPLE 1

A roll of electrodeposited 35 µm, one ounce copper foil, 0.64 meters in width is mounted on an unwind roller. The foil is threaded through tensioning rollers, through idler rollers, and onto a rewind roller. The foil is then tensioned to 4 pounds per inch width. A drive motor on the rewind roller is engaged and set to 1.2 meters/minute. A liquid polyimide resin is adjusted to 25% solids, a viscosity of about 20,000 centipose, with N-methylpyrrolidone in a stainless steel mixing vat. The polyimide solution is supplied to a dispensing system and a film of approximately 50 µm is applied to the matte side of the moving foil using gravity and the liquid polymer viscosity as dispensing forces.

A doctor blade is adjusted to produce a wet film of 43 µm in thickness, resulting in a flexible composite having a dried polymer film in thickness of about 7.6 µm. A continuous liquid head height and volume of dammed material is maintained on the upstream side of the doctor blade to maintain a constant flexible composite film thickness and a film free of included air bubbles.

The solvent is evaporated off and the polymer is cured in an oven at 425° C. As the coated foil first enters the oven, an initial temperature drop should be anticipated. Once steady state temperatures are achieved in the oven, film thickness is checked by taking a foil sample and comparing the coated weight to the base weight of the foil using the polyimide density to convert from weight to film thickness. Adjustments to the rate of polyimide dispensed and or doctor blade height over the foil are made based on this measurement. This process is repeated until the desired film thickness is attained.

The shiny side of the foil is then cleaned and micro-etched with sodium persulfate, followed by a water rinse and application of a photosensitive resist. The photoresist is dried and imagewise exposed through a mask to actinic radiation using a UV exposure unit to thereby form image and nonimage areas. The photoresist is then developed using an aqueous sodium carbonate solution to remove the non-image areas and leaving the image areas. The foil is then etched in cupric chloride to form a copper pattern. The balance of the resist is stripped away using potassium hydroxide leaving the desired copper pattern.

The foil is cut into rectangular sections which are then punched with tooling holes using a optically registering mechanical punch. The copper pattern on the foil sections is then treated with a solution containing 31 g/l of sodium hydrochlorite, 15 g/l of sodium hydroxide and 12 g/l of trisodium phosphate, at 85° C. under agitation for 3 minutes thereby to provide a black oxide treatment.

The treated foil section is then laminated to an epoxy substrate reinforced with fiberglass, in a hydraulic press at 275° C. and 10 kg/cm$^2$ for 30 minutes. The press is under vacuum of 28 inches of mercury. A second foil section is laminated to the first foil section to thereby form a multi-layered circuit structure.

EXAMPLE 2

Example 1 is repeated except that the step black oxide treatment is conducted by dipping the copper foil for three minutes in an aqueous black oxide treatment solution at 85° C. having the following composition:

$NaClO_2$—31 g/l
NaOH—15 g/l
$Na_3PO_4$—12 g/l

EXAMPLE 3

Example 1 is repeated except a 10 μm sheet of p-phenylene-2,6-benzobisoxazole paper is laminated between the polyimide surfaces of the foil sections on the substrate. Resulting product has improved dimensional stability and tear resistance.

EXAMPLE 4

Example 1 is repeated except lamination is done using a continuous hot roll lamination process at 300° C. and 21 kg/cm$^2$. The product is subjected to a post lamination oven bake to achieve final cure.

EXAMPLE 5

Example 1 is repeated except coating is done with an extrusion coater and lamination is done by a nip roller process. A filler is coextruded with the polyimide.

EXAMPLE 6

Example 1 is repeated except the matte side of the foil is treated with nodules to improve mechanical adhesion to the polyimide. Maximum nodule size is less than 120 micro-inches to avoid the possibility of high potential failures.

EXAMPLE 7

Example 1 is repeated except that a fiberglass cloth is impregnated with a non-halogenated thermosetting polyimide (Keramid 601), forming a prepreg. The polymer is then partially cured. The thickness of this prepreg is about 68 μm. The copper foil is then laminated to the prepreg with the polymer coating facing the prepreg. The lamination is done under a vacuum (28 inches of Hg) at 275° C., with 14 kg/cm$^2$ of pressure for 90 minutes.

EXAMPLE 8

Example 7 is repeated except a non-halogenated epoxy replaces the thermosetting polyimide. The lamination is conducted at 185° C. for 60 minutes.

EXAMPLE 9

Example 7 is repeated except the substrate is another fiberglass and the prepreg thickness is about 115 μm.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A continuous process for forming a multilayered circuit structure which comprises:
   (a) unrolling a roll of copper foil, which foil has a shiny surface side and a matte surface side;
   (b) applying and curing a film-forming polymer onto the matte side of the foil,
   (c) optionally cleaning the shiny side of the foil;
   (d) applying and optionally drying a photoresist onto the shiny side of the foil;
   (e) imagewise exposing the photoresist to actinic radiation to thereby form image and nonimage areas;
   (f) developing the photoresist thereby removing the non-image areas and leaving the image areas;
   (g) etching the foil under the removed nonimage areas of the photoresist to thereby form a copper pattern;
   (h) optionally removing the remaining photoresist;
   (i) cutting the foil into sections;
   (j) optionally punching registration holes through the foil;
   (k) optionally treating the copper pattern with a bond enhancing treatment;
   (l) optionally inspecting the copper pattern for defects; and
   (m) laminating at least one foil section to a substrate; thus forming a multilayered circuit structure.

2. The process of claim 1 wherein the film forming polymer comprises a polyimide, polyester, or combinations thereof.

3. The process of claim 1 comprising laminating a plurality of the foil sections together.

4. The process of claim 1 comprising laminating a plurality of the foil sections together via a substrate between adjacent sections.

5. The process of claim 4 wherein the substrate comprises a reinforced polymer.

6. The process of claim 1 wherein the substrate comprises a reinforced polymer which comprises an epoxy, polyimide, polyester, cyanate ester, bismaleimide-epoxy or combinations thereof.

7. The process of claim 1 wherein the process is stopped after exposing the photoresist to radiation.

8. The process of claim 1 wherein the process is stopped after stripping the photoresist.

9. The process of claim 1 wherein the foil is etched by acid etching.

10. The process of claim 1 wherein the foil is etched by alkaline etching.

11. The process of claim 1 wherein the shiny side of the foil is cleaned according to step (c) after step (b).

12. The process of claim 1 wherein holes are punched through the foil according to step (i) after step (h).

13. The process of claim 1 wherein the copper pattern is treated with a bond enhancing treatment according to step (k) after step (j).

14. The process of claim 1 wherein the copper pattern is treated with a black oxide treatment according to step (k) after step (j).

15. The process of claim 1 wherein the shiny side of the foil is not cleaned according to step (c) and the copper pattern is not treated with an oxide according to step (k).

16. The process of claim 1 wherein the foil is punched according to step (j) after step (i).

17. The process of claim 1 wherein the copper pattern is inspected according to step (l) after step (k).

18. The process of claim 1 wherein the foil is rolled up after curing of the film forming polymer according to step (b) and then unrolled prior to step (c).

19. The process of claim 1 wherein the foil is rolled up after drying of the photoresist according to step (d) and then unrolled prior to step (e).

20. The process of claim 1 wherein the foil is rolled through an accumulator.

21. A continuous process for forming a multilayered circuit structure which comprises:
   (a) unrolling a roll of copper foil, which foil has a shiny surface side and a matte surface side;
   (b) applying and curing a film-forming polymer onto the matte side of the foil,
   (c) cleaning the shiny side of the foil;
   (d) applying and drying a photoresist onto the shiny side of the foil;
   (e) imagewise exposing the photoresist to actinic radiation to thereby form image and nonimage areas;
   (f) developing the photoresist thereby removing the nonimage areas and leaving the image areas;
   (g) etching the foil under the removed nonimage areas of the photoresist to thereby form a copper pattern;
   (h) removing the remaining photoresist;
   (i) cutting the foil into sections;
   (j) punching registration holes through the foil;
   (k) treating the copper pattern with a bond enhancing treatment;
   (l) inspecting the copper pattern for defects; and
   (m) laminating at least one foil section to a substrate; thus forming a multilayered circuit structure.

22. A continuous process for forming a multilayered circuit structure which comprises:
   (a) unrolling a roll of copper foil, which foil has a shiny surface side and a matte surface side, both sides having been treated with bond enhancing treatment;
   (b) applying and curing a film-forming polymer onto either side of the foil,
   (c) optionally cleaning the side of the foil that has not been applied with the film-forming polymer;
   (d) applying and optionally drying a photoresist onto the uncoated side of the foil;
   (e) imagewise exposing the photoresist to actinic radiation to thereby form image and nonimage areas;
   (f) developing the photoresist thereby removing the nonimage areas and leaving the image areas;
   (g) etching the foil under the removed nonimage areas of the photoresist to thereby form a copper pattern;
   (h) optionally removing the remaining photoresist;
   (i) cutting the foil into sections;
   (j) optionally punching registration holes through the foil;
   (k) optionally inspecting the copper pattern for defects; and
   (l) laminating at least one foil section to a substrate; thus forming a multilayered circuit structure.

23. A continuous process for forming a multilayered circuit structure which comprises:
   (a) unrolling a roll of copper foil, which foil has a shiny surface side and a matte surface side, whose shiny side has been treated with a bond enhancing treatment;
   (b) applying and curing a film-forming polymer onto the shiny side of the foil,
   (c) optionally cleaning the matte side of the foil;
   (d) applying and optionally drying a photoresist onto the shiny side of the foil;
   (e) imagewise exposing the photoresist to actinic radiation to thereby form image and nonimage areas;
   (f) developing the photoresist thereby removing the nonimage areas and leaving the image areas;
   (g) etching the foil under the removed nonimage areas of the photoresist to thereby form a copper pattern;
   (h) optionally removing the remaining photoresist;
   (i) cutting the foil into sections;
   (j) optionally punching registration holes through the foil;
   (k) optionally treating the copper pattern with a bond enhancing treatment;
   (l) optionally inspecting the copper pattern for defects; and
   (m) laminating at least one foil section to a substrate; thus forming a multilayered circuit structure.

* * * * *